(12) United States Patent
Hsu et al.

(10) Patent No.: US 7,598,128 B2
(45) Date of Patent: Oct. 6, 2009

(54) THIN SILICON-ON-INSULATOR DOUBLE-DIFFUSED METAL OXIDE SEMICONDUCTOR TRANSISTOR

(75) Inventors: Sheng Teng Hsu, Camas, WA (US); Jong-Jan Lee, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 311 days.

(21) Appl. No.: 11/805,212

(22) Filed: May 22, 2007

(65) Prior Publication Data

US 2008/0290408 A1 Nov. 27, 2008

(51) Int. Cl.
*H01L 21/332* (2006.01)
(52) U.S. Cl. ....................................... 438/140
(58) Field of Classification Search ............ None
See application file for complete search history.

(56) References Cited

U.S. PATENT DOCUMENTS

| 5,780,900 A * | 7/1998 | Suzuki et al. ............... 257/335 |
| 2002/0109184 A1* | 8/2002 | Hower et al. ................ 257/335 |
| 2004/0155284 A1* | 8/2004 | Kim .......................... 257/324 |

OTHER PUBLICATIONS

A-BCD Technology, Philip Semiconductors Advanced Bipolar-CMOS-DMOS Smart Power Process Technology.
N. Nenadovic, et al, "RF Power Silicon-On-Glass VDMOSFETs" IEEE EDL25, #6 p. 424, 2004.
M. Wasekura et al, "An SOI-BiCDMOS Chipset for Automotive Electronically Controlled Brake System" 2006 IEEE SOI International OSI conference Proceeding, Paper 7.1.

* cited by examiner

*Primary Examiner*—Tu T Nguyen
*Assistant Examiner*—Ker-Ming Chin
(74) *Attorney, Agent, or Firm*—Law Office of Gerald Maliszewski; Gerald Maliszewski

(57) ABSTRACT

A method is provided for fabricating a silicon (Si)-on-insulator (SOI) double-diffused metal oxide semiconductor transistor (DMOST) with a stepped channel thickness. The method provides a SOI substrate with a Si top layer having a surface. A thinned area of the Si top layer is formed, and a source region is formed in the thinned Si top layer area. The drain region is formed in an un-thinned area of the Si top layer. The channel has a first thickness adjacent the source region with first-type dopant, and a second thickness, greater than the first thickness, adjacent the drain region. The channel also has a sloped thickness between the first and second thicknesses. The second and sloped thicknesses have a second-type dopant, opposite of the first-type dopant. A stepped gate overlies the channel.

10 Claims, 5 Drawing Sheets

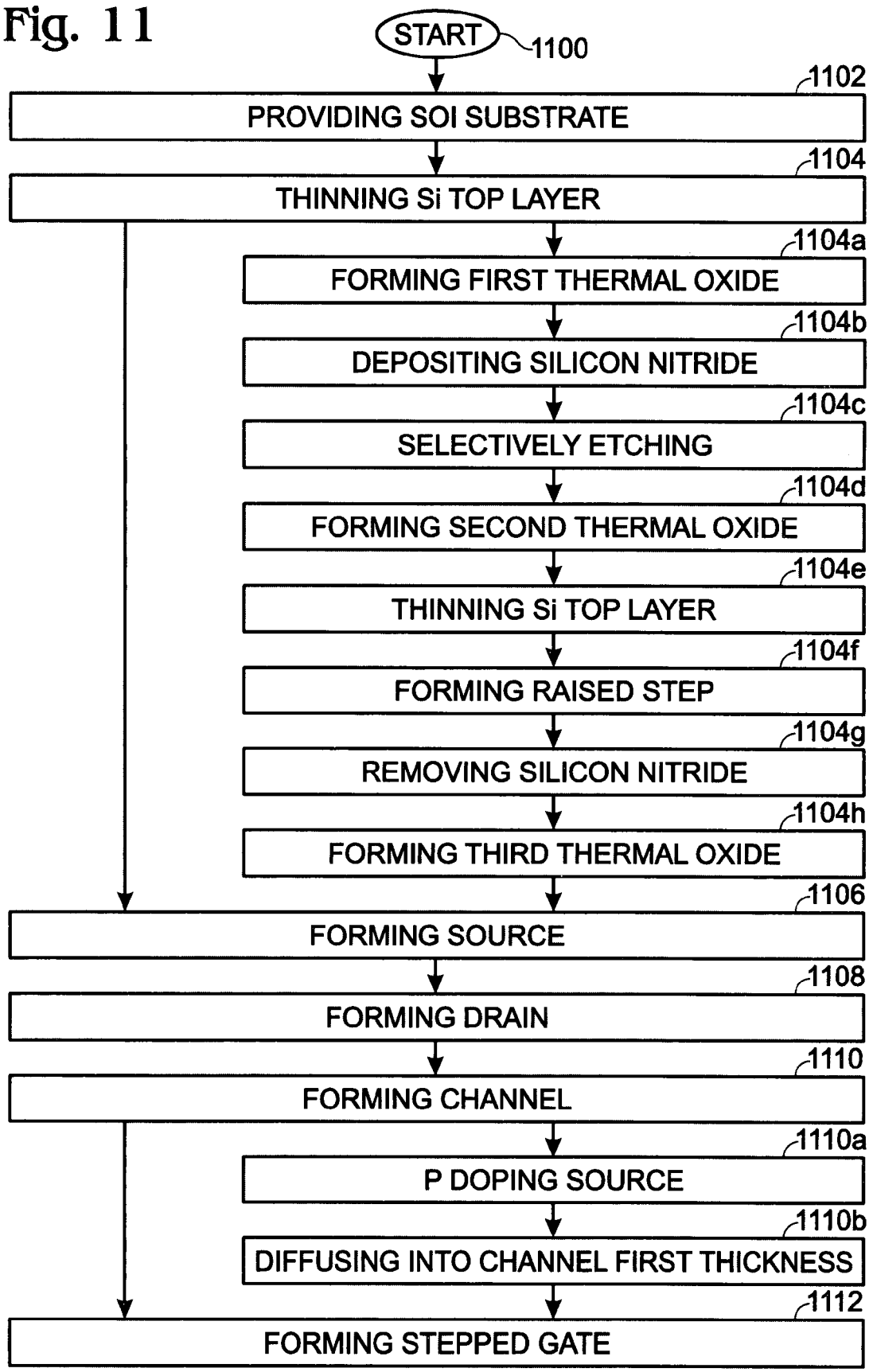

THIN SILICON-ON-INSULATOR DOUBLE-DIFFUSED METAL OXIDE SEMICONDUCTOR TRANSISTOR

BACKGROUND OF THE INVENTION

1. Field of the Invention

This invention generally relates to integrated circuit (IC) fabrication and, more particularly, to a double-diffused metal oxide semiconductor transistor (DMOST) with a multi-thickness channel fabricated on SOI for medium power device applications.

2. Description of the Related Art

FIG. 1 is a partially cross-sectional view of a vertical output DMOST device with substrate contact to the drain output (prior art). One limitation of a conventional planar MOS device is that the channel length is proportional to the breakdown voltage, but inversely proportional to current. That is, high current planar devices require a very short channel length and, therefore, have a very low breakdown voltage. To address this short channel limitation, DMOST devices were developed. A DMOST device is formed by a double-diffusion. For example, an n-channel DMOST is conventionally formed by a deep p+ implant, followed by a shallow n+ implant. Unlike planar MOS devices, which control channel length using a photolithographic process, the channel length of a DMOST is controlled by the difference between the diffusions of the p+ implant and the n+ implant species to form a p-body and n+ source regions.

State-of-the-art high voltage high power transistors are conventionally fabricated either on bulk silicon or on compound semiconductors. Compound semiconductor substrate costs are very high. In addition, the compound semiconductor processes are not compatible with silicon integrated circuit processes. As a result, the cost of compound semiconductor high voltage high power devices is very high and, therefore, not suitable for consumer applications. If fabricated on bulk silicon, the high voltage transistor must be a DMOST design. A DMOST utilizes double diffusion to form a very short channel length transistor with a very long depletion region to sustain high voltages.

A bulk silicon DMOST conventionally requires a large device area and, in addition, the output is made via the substrate contact, "underneath" the transistor active regions. Although front ("top") output lateral DMOSTs (LDMOSTs) have also been fabricated, the area required for these devices is even larger than for back output devices. The depletion area of the DMOST, whether it is back output or front output device, is also very large. The depletion region is the main source of the leakage current, which increases exponentially with temperature. Thus, the bulk silicon DMOST is not suitable for high temperature high voltage applications.

The use of silicon-on-insulator (SOI) substrates offers many potential advantages for the fabrication of high temperature power devices. Some of the potential advantages are: complete device isolation, small device size, low leakage current at high temperatures, and simple fabrication processes. The complete isolation of devices eliminates crosstalk among the devices in the same chip. Because of the isolation, power devices, linear circuits, and digital circuits can be integrated together without the use of large isolation areas. Potentially, a low leakage current can be achieved by using a very thin top active silicon film. The volume of the junction depletion layer would be small enough to not generate large leakage current even at high temperatures.

Power transistors have been fabricated on SOI substrates from bipolar transistor, conventional DMOS transistor designs, or as a combination of conventional DMOS and bipolar transistors. Since conventional DMOS and bipolar transistor designs both require thick silicon films, these designs fail to make use of all the above-mentioned potential advantages available with the use of SOI substrate. For example, Philip's A-BCD technology requires a 1.5 µm layer of active silicon films. A design proposed by Nenadovic requires a 5 µm of active top silicon film, and a design proposed by Wasekura requires a 12 µm layer of top active silicon film. Since the leakage current is proportional to the volume of the junction depletion region, these thick top active silicon films generate high leakage currents, which are especially problematic at high temperatures. Further, since conventional commercially available SOI wafers are fabricated with less than a 1.5 µm top active silicon film thickness, the above-mentioned thick-film designs require a high cost, custom type of SOI wafer.

It would be advantageous if a high power DMOST device could be fabricated on a SOI wafer using a thin active film region to minimize leakage current.

SUMMARY OF THE INVENTION

The present invention describes a new type of DMOS fabricated on SOI wafers. The active gate is fabricated on a very thin top silicon layer, which is compatible to Fully Depleted SOI technology (FD SOI), and the drain drift area has thicker top silicon film so that the drain parasitic resistance is reduced. The fully depleted active channel area results a very small parasitic capacitance. This device provides a high drive current comparable to conventional DMOS designs, but with a much lower on resistance and much smaller device area. The starting wafer is a standard commercially available SOI wafers. The device structure and the processes are also compatible with FD SOI technology. The device is individually island isolated and has very small depletion region volume. Therefore, high frequency, small area, high voltage, and low leakage current devices can be achieved. Although FD SOI compatibility is described in this application, depending on the device tuning, the present invention is also compatible with the fabrication of partially depleted (PD) SOI devices. The advantages associated with using FDSOI devices are also applicable to PDSOI devices. More particularly, the present invention active gate is compatible with FDSOI and PDSOI devices, depending on device tuning.

Accordingly, a method is provided for fabricating a silicon (Si)-on-insulator (SOI) double-diffused metal oxide semiconductor transistor (DMOST) with a stepped channel thickness. The method provides a SOI substrate with a Si top layer having a surface. A thinned area of the Si top layer is formed, and a source region is formed in the thinned Si top layer area. The drain region is formed in an un-thinned area of the Si top layer. The channel has a first thickness adjacent the source region with first-type dopant, and a second thickness, greater than the first thickness, adjacent the drain region. The channel also has a sloped thickness between the first and second thicknesses. The second and sloped thicknesses have a second-type dopant, opposite of the first-type dopant. A stepped gate overlies the channel.

For example, the SOI Si top layer may have a (pre-process) thickness in the range of 0.5 to 1.5 micrometers, and be n– doped to a density in a range of $1 \times 10^{15}$ to $1 \times 10^{17}$ per cubic centimeter ($cm^{-3}$). The channel first thickness is doped by selectively p doping the source region with a boron (B) ion implant, and thermally diffusing B ions from the source into the channel first thickness. The channel second thickness and sloped thickness are doped with the second-type dopant by simply leaving these areas of the channel n− doped.

Additional details of the above-described method, and an SOI DMOST with a stepped channel thickness, are presented below.

BRIEF DESCRIPTION OF THE DRAWINGS

FIG. 11 is a flowchart illustrating a method for fabricating a SOI DMOST with a stepped channel thickness.

DETAILED DESCRIPTION

Figure 2:
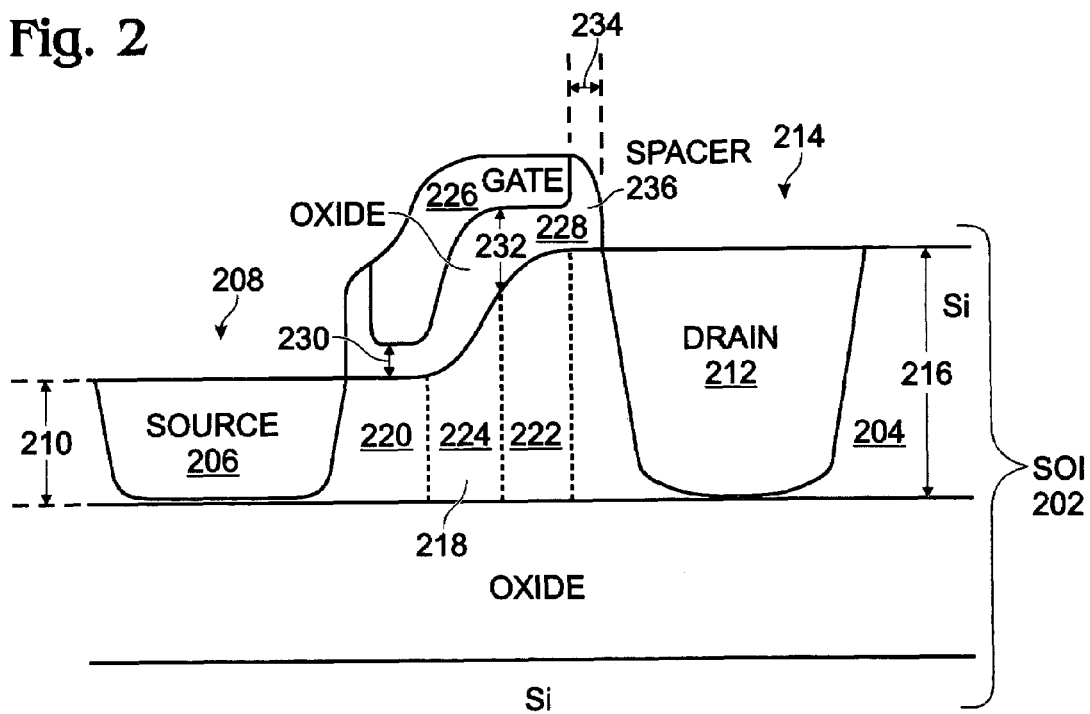
FIG. 2 is a partial cross-sectional view of a silicon (Si)-on-insulator (SOI) double-diffused metal oxide semiconductor transistor (DMOST) with a stepped channel thickness.

FIG. 2 is a partial cross-sectional view of a silicon (Si)-on-insulator (SOI) double-diffused metal oxide semiconductor transistor (DMOST) with a stepped channel thickness. The DMOST 200 comprises a SOI substrate 202 with a Si top layer 204. A source region 206 is formed in an area 208 of the Si top layer having a first thickness 210. A drain region 212 is formed in an area 214 of the Si top layer having a second thickness 216, greater than the first thickness. A channel 218 has the first thickness area 220 adjacent the source region 206 with a first-type dopant, a second thickness area 222 adjacent the drain region 212, and a sloped thickness 224 between the first and second thicknesses. The second and sloped thickness areas of the channel have a second-type dopant, opposite of the first-type dopant. For example, if the first dopant is p-type, the second dopant is n-type. A stepped gate 226 overlies the channel 218.

In one aspect, the source region first thickness 210 is in the range of 10 to 100 nanometers (nm). The drain second thickness 216 is in the range of 0.5 to 1.5 micrometers, which is the thickness of a conventional commercially available SOI wafer top Si layer.

In another aspect, a stepped gate oxide layer 228 overlies the channel 218, having a thickness 230 in the range of 5 to 20 nm overlying the channel first thickness area 220. The stepped gate oxide layer 228 has a thickness 232 in the range of 20 to 50 nm overlying the second and sloped thickness areas, 222 and 224, respectively.

In one example, the stepped gate 226 is n+ polysilicon doped to a density in a range of $1\times10^{19}$ to $1\times10^{21}$ cm$^{-3}$. The channel second and sloped thickness areas 222/224 are n− doped to a density in a range of $1\times10^{15}$ to $1\times10^{17}$ per cubic centimeter (cm$^{-3}$). The channel first thickness area 220 is p doped to a density in a range of $1\times10^{16}$ to $1\times10^{18}$ per cubic cm$^{-3}$. The source region 206 is n+ doped to density in a range of $1\times10^{19}$ to $1\times10^{21}$ cm$^{-3}$. The drain region 212 is separated from the stepped gate 226 by a distance 234 in a range of 0 to 5 micrometers, and n+ doped to a density in a range of $1\times10^{19}$ to $1\times10^{21}$ cm$^{-3}$. Note: if the distance 234 is greater than zero, it is likely that a photolithography process mask (not shown) has been used to create the distance. Spacers 236 are also shown. Similar DMOST devices may be fabricated by those skilled in the art using variations of the above-described doping scheme.

Functional Description

Figure 1:
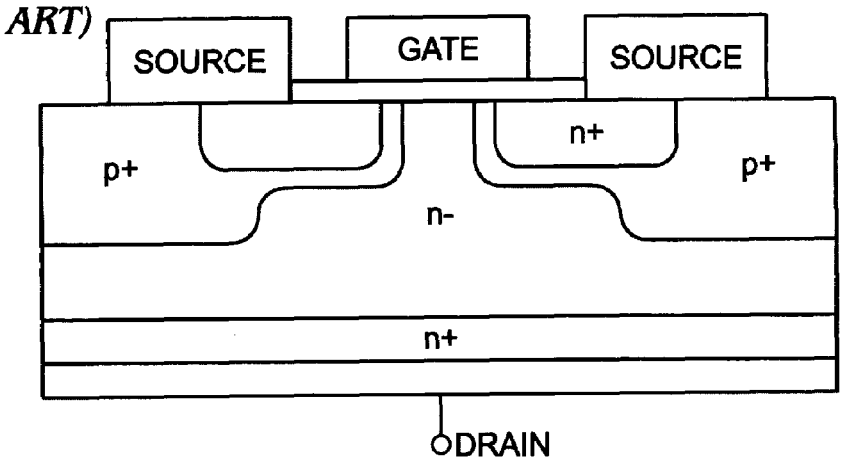
FIG. 1 is a partially cross-sectional view of a vertical output DMOST device with substrate contact to the drain (prior art).

FIGS. 3 through 10 depict steps in the process of fabricating the stepped channel thickness DMOST device of FIG. 1.

Figure 3:
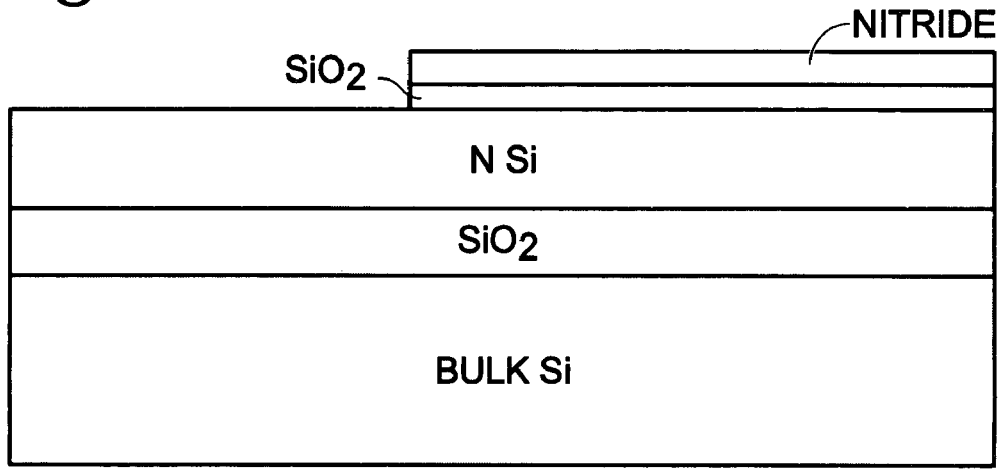
FIGS. 3 through 10 depict steps in the process of fabricating the stepped channel thickness DMOST device of FIG. 1.

In FIG. 3, the device fabrication process begins with a commercially available SOI substrate. The thickness of the top silicon layer is 0.5 to 1.5 µm, and the buried oxide layer (BOX) has a thickness in the range of 0.5 to 3 µm. Phosphorous ions are implanted to dope the film n-type, with a doping density on the orders of $1\times10^{15}$ to $1\times10^{17}$/cm$^3$. The Si top layer is thermal oxidized to grow 20 nm to 50 nm of thermal oxide. Then, 20 nm to 200 nm of Si$_3$N$_4$ is deposited. After forming a photoresist mask, the Si$_3$N$_4$ and thermal oxide are selectively etched, except over the drain region.

Figure 4:
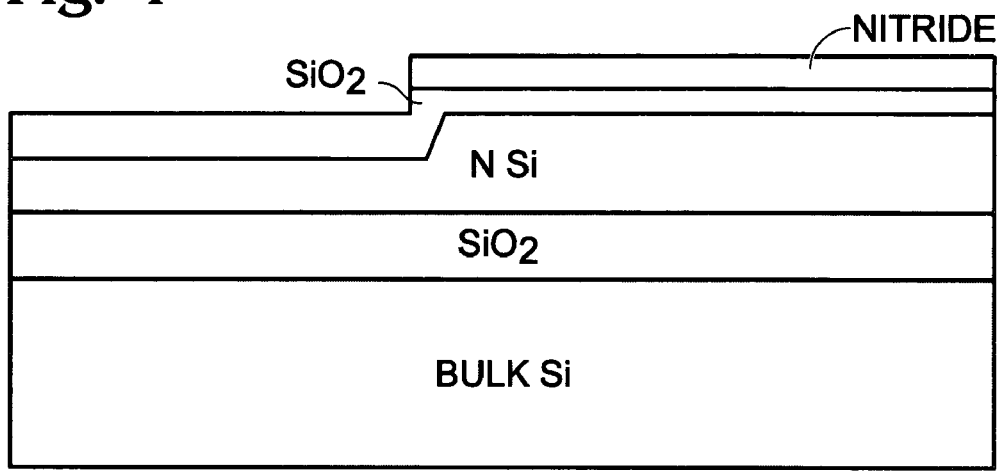

In FIG. 4, a thermal oxidation process is performed to thin the top silicon to the requirement of FD SOI transistors (not shown), which may be fabricated on other parts of the wafer. The thermal oxidation is in the range of 500 nm to 2000 nm. Alternately, areas of the top Si layer are left un-thinned for other (non-DMOS) transistors being fabricated on the wafer, or only partially thinned. For example, partially depleted (PD SOI) transistors may be formed in adjacent areas of the wafer.

Figure 5:
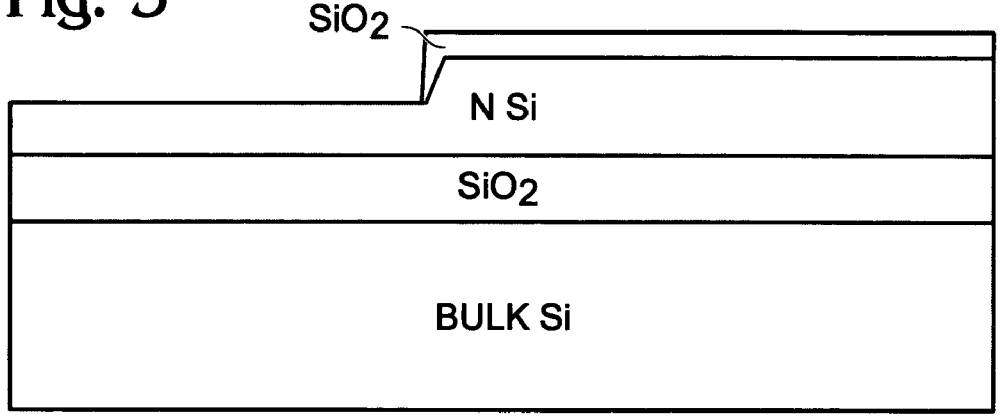

In FIG. 5, the second thermal oxide layer is etched, followed by the removal of the Si$_3$N$_4$.

Figure 6:
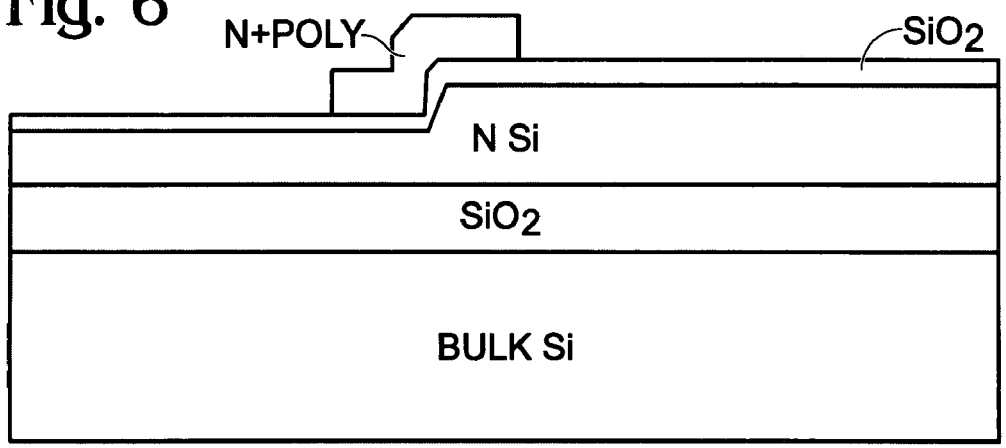

In FIG. 6, a thermal oxidation process is performed to grow gate oxide (5-20 nm). This gate oxide is also used as the gate oxide for the FD SOI transistors (not shown). Polysilicon, or any other state-of-the-art gate electrode material, is deposited for the gate electrode. The polysilicon can either doped n+ or undoped polysilicon. This polysilicon is also used as the gate electrode for the FD SOI transistors. Photoresist masks permit the polysilicon to be selectively etched to form the stepped gate electrode as shown.

Figure 7:
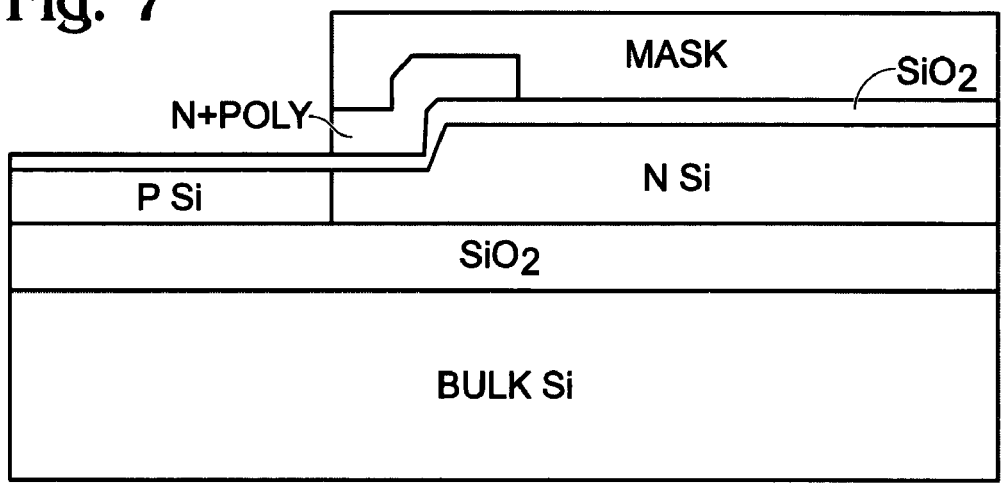

As shown in FIG. 7, photoresist is used to mask the drain region of the high voltage DMOS transistor. A boron ion implantation is performed with a dose on the order of $10^{12}$ to $10^{13}$/cm$^2$. The boron ion energy is 5 keV to 50 keV. After implantation, the photoresist mask is stripped.

Figure 8:
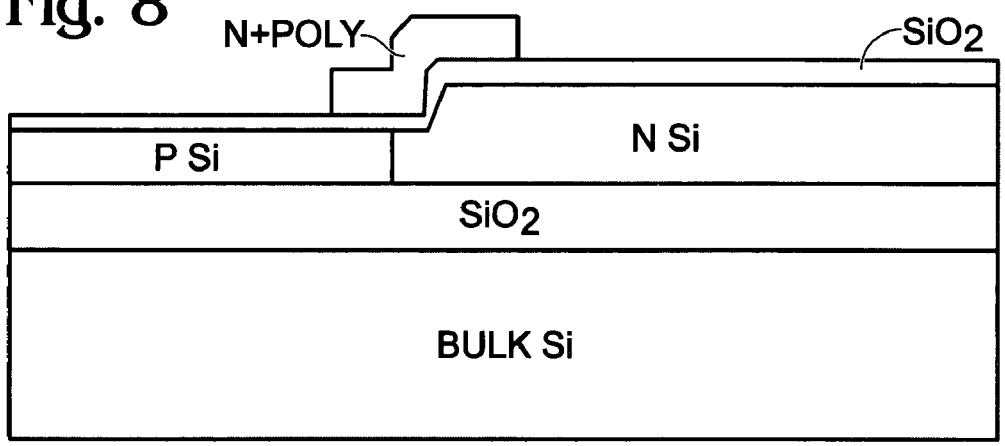

In FIG. 8, a thermal treatment is used to diffuse boron ions from source region to the adjacent channel region. The diffusion temperature is in the range of 950° C. to 1050° C., and the diffusion time is in the range of 10 minutes to 10 hours.

Figure 9:
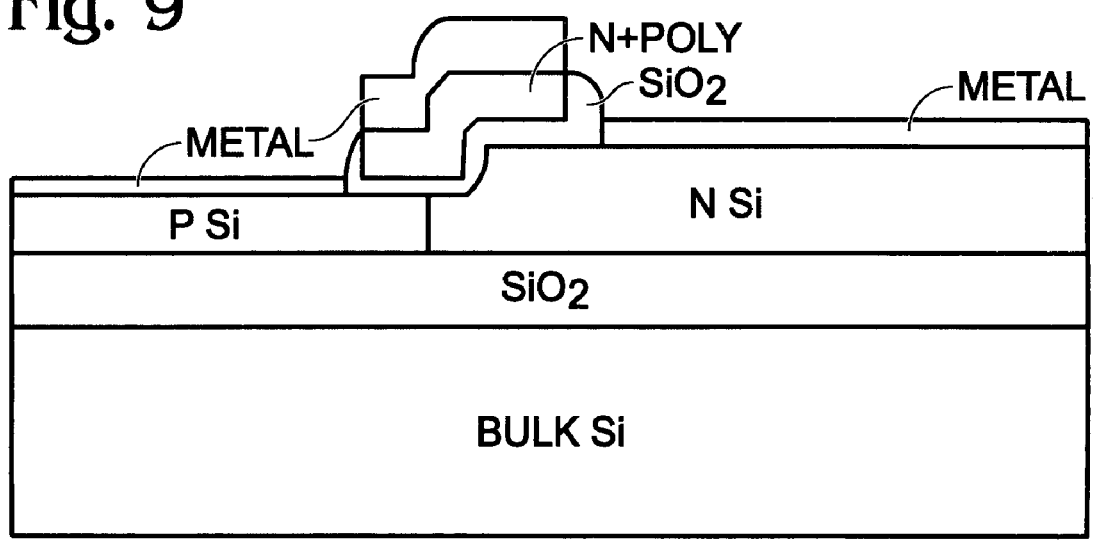

In FIG. 9, the remaining process steps can be performed using any of the state-of-the-art process for sidewall oxide formation, selective epitaxy growth, salicidation, and metallization.

Figure 10:
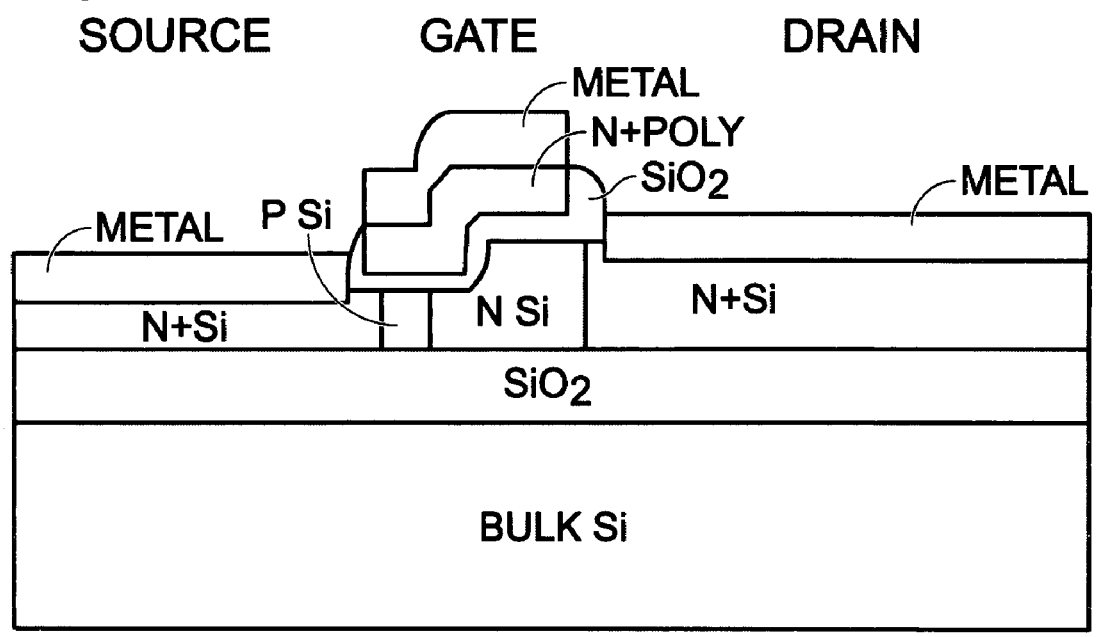

FIG. 10 depicts the completed thin SOI DMOS. As noted above, the thick oxide on the drain side of the gate is a thermally grown oxide, formed prior to thinning the top silicon film to the thickness required for any low voltage PD or FD SOI transistors being fabricated on the same wafer. The channel region is diffused from the boron implanted into the source side that diffuses under the gate region. Raised source and drain regions may be used to lower the parasitic resistances.

FIG. 11 is a flowchart illustrating a method for fabricating a SOI DMOST with a stepped channel thickness. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 1100.

Step 1102 provides a SOI substrate with a Si top layer having a surface. The SOI substrate provided may include a Si top layer having a thickness in a range of 0.5 to 1.5 micrometers, n− doped to a density in a range of $1\times10^{15}$ to $1\times10^{17}$ per cubic centimeter (cm$^{-3}$). Step 1104 forms a thinned area of the Si top layer. Step 1106 forms a source region in the thinned Si top layer area. Step 1108 forms a drain region in an un-thinned area of the Si top layer. Step 1110 forms a channel having a first thickness adjacent the source region with first-type dopant, a second thickness, greater than the first thickness, adjacent the drain region, and a sloped thickness between the first and second thicknesses. The second and sloped thicknesses have a second-type dopant, opposite of the first-type dopant. Step 1112 forms a stepped gate overlying the channel.

In one aspect, forming a thinned region of the Si top layer in Step 1104 includes substeps. Step 1104a forms a first thermal oxide on the surface of the Si top layer. Step 1104b deposits silicon nitride overlying the first thermal oxide. Step 1104c selectively etches the first thermal oxide and silicon nitride overlying the source region. Step 1104d form a second thermal oxide on the Si top layer surface overlying the source region. Step 1104e thins the Si top layer overlying the source region in response to forming the second thermal oxide. Step 1104f etches the second thermal oxide, forming a raised step in the top Si layer between the source and drain regions. Step 1104g removes any remaining silicon nitride, leaving the first thermal oxide overlying the drain region, the channel second thickness, and the channel sloped thickness. Step 1104h, subsequent to removing the silicon nitride, forms a third thermal oxide overlying the source region and the channel first thickness having a thickness of the range of 5 to 20 nm. The end result is that the Si top layer is thinned to a thickness in the range of 10 to 100 nm.

For example, the first thermal oxide may have a thickness in a range of 20 to 50 nm, and the silicon nitride may be deposited to a thickness in a range of 20 to 200 nm. The second thermal oxide may have a thickness in the range of 500 to 2000 nm.

In one aspect, forming the stepped gate in Step 1112 includes selectively forming an n+ polysilicon layer overlying the channel first, second, and sloped thicknesses.

In another aspect, forming the channel first thickness with the first-type dopant in Step 1110 includes substeps. Step 1110a selectively p dopes the source region with a boron (B) ion implant using a dose in a range of $1\times10^{12}$ to $1\times10^{13}$ per squared cm ($cm^{-2}$) and an energy in a range of 5 thousand electronvolts (KeV) to 50 KeV. Step 1110b thermally diffuses B ions from the source into the channel first thickness. In one aspect, diffusing B ions from the source into the channel first thickness in Step 1110b includes: heating the substrate to a temperature in a range of 950° C. to 1050° C.; and, heating for a time duration in a range of 10 minutes to 10 hours. Forming the channel second thickness and sloped thickness with the second-type dopant in Step 1110 includes leaving the second thickness and the sloped thickness of the channel n–doped.

In one aspect, forming the source and drain regions in Steps 1106 and 1108 includes: performing an n ion implant into the stepped gate, source, and drain regions; and, forming n+ doped source and drain regions having a doping density in a range of $1\times10^{19}$ to $1\times10^{21}$ $cm^{-3}$, with the drain separated from the stepped gate by a distance in the range of 0 to 5 micrometers.

A SOI DMOST with a stepped channel thickness has been provided along with an associated fabrication process. Specific examples of structures, materials, doping levels, and layer thicknesses have been given to illustrate the invention. However, the invention is not limited to just these examples. Other variations and embodiments of the invention will occur to those skilled in the art.

We claim:

1. A method for fabricating a silicon (Si)-on-insulator (SOI) double-diffused metal oxide semiconductor transistor (DMOST) with a stepped channel thickness, the method comprising:

providing a SOI substrate with a Si top layer having a surface;
forming a thinned area of the Si top layer;
forming a source region in the thinned Si top layer area;
forming a drain region in an un-thinned area of the Si top layer;
forming a channel having a first thickness adjacent the source region with first-type dopant, a second thickness, greater than the first thickness, adjacent the drain region, and a sloped thickness between the first and second thicknesses, the second and sloped thicknesses having a second-type dopant, opposite of the first-type dopant; and,
forming a stepped gate overlying the channel.

2. The method of claim 1 wherein forming a thinned region of the Si top layer includes:

forming a first thermal oxide on the surface of the Si top layer;
depositing silicon nitride overlying the first thermal oxide;
selectively etching the first thermal oxide and silicon nitride overlying the source region;
forming a second thermal oxide on the Si top layer surface overlying the source region;
thinning the Si top layer overlying the source region in response to forming the second thermal oxide;
etching the second thermal oxide, forming a raised step in the top Si layer between the source and drain regions; and,
removing any remaining silicon nitride, leaving the first thermal oxide overlying the drain region, the channel second thickness, and the channel sloped thickness.

3. The method of claim 2 wherein forming the first thermal oxide includes forming a thermal oxide having a thickness in a range of 20 to 50 nanometers (nm);

wherein depositing the silicon nitride includes depositing silicon nitride having a thickness in a range of 20 to 200 nm;
wherein forming the second thermal oxide includes forming a thermal oxide having a thickness in a range of 500 to 2000 nm; and,
wherein thinning the Si top layer overlying the source region includes thinning the Si top layer to a thickness in a range of 10 to 100 nm.

4. The method of claim 2 wherein forming a thinned region of the Si top layer further includes, subsequent to removing the silicon nitride, forming a third thermal oxide overlying the source region and the channel first thickness having a thickness in a range of 5 to 20 nm.

5. The method of claim 4 wherein forming the stepped gate includes selectively forming an n+ polysilicon layer overlying the channel first, second, and sloped thicknesses.

6. The method of claim 5 wherein providing the SOI substrate includes providing a Si top layer having a thickness in a range of 0.5 to 1.5 micrometers, n– doped to a density in a range of $1\times10^{15}$ to $1\times10^{17}$ per cubic centimeter ($cm^{-3}$).

7. The method of claim 6 wherein forming the channel first thickness with the first-type dopant includes:

selectively p doping the source region with a boron (B) ion implant using a dose in a range of $1\times10^{12}$ to $1\times10^{13}$ per squared cm ($cm^{-2}$) and an energy in a range of 5 thousand electronvolts (KeV) to 50 KeV; and,
thermally diffusing B ions from the source into the channel first thickness.

8. The method of claim 7 wherein thermally diffusing B ions from the source into the channel first thickness includes:

heating the substrate to a temperature in a range of 950° C. to 1050° C.; and, heating for a time duration in a range of 10 minutes to 10 hours.

9. The method of claim 7 wherein forming the channel second thickness and sloped thickness with the second-type dopant includes leaving the second thickness and the sloped thickness of the channel n− doped.

10. The method of claim 9 wherein forming the source and drain regions includes:

performing an n ion implant into the stepped gate, source, and drain regions; and, forming n+ doped source and drain regions having a doping density in a range of $1 \times 10^{19}$ to $1 \times 10^{21}$ cm$^{-3}$, with the drain separated from the stepped gate by a distance in the range of 0 to 5 micrometers.

* * * * *